United States Patent
Wang (10) Patent No.: US 11,360,153 B1
(45) Date of Patent: Jun. 14, 2022

(54) MANAGEMENT OF USED BATTERY CELLS BASED ON FUEL GAUGE PARAMETERS

(71) Applicant: Amazon Technologies, Inc., Seattle, WA (US)

(72) Inventor: Ligong Wang, Seattle, WA (US)

(73) Assignee: Amazon Technologies, Inc., Seattle, WA (US)

(*) Notice: Subject to any disclaimer, the term of this patent is extended or adjusted under 35 U.S.C. 154(b) by 828 days.

(21) Appl. No.: 16/219,298

(22) Filed: Dec. 13, 2018

(51) Int. Cl.
*G01R 31/392* (2019.01)
*G01R 31/36* (2020.01)
*G01R 31/382* (2019.01)
*G01R 31/396* (2019.01)

(52) U.S. Cl.
CPC ....... *G01R 31/392* (2019.01); *G01R 31/3648* (2013.01); *G01R 31/382* (2019.01); *G01R 31/396* (2019.01)

(58) Field of Classification Search
CPC .................................................. G01R 31/392
See application file for complete search history.

(56) References Cited

U.S. PATENT DOCUMENTS

| | | | | |
|---|---|---|---|---|
| 6,400,123 B1* | 6/2002 | Bean | ................ | G01R 31/3648 320/132 |
| 2013/0169235 A1* | 7/2013 | Patino | ................ | H01M 10/482 320/136 |
| 2014/0125344 A1* | 5/2014 | Knight | ................ | G01R 31/367 324/426 |
| 2015/0377971 A1* | 12/2015 | Keating | ................ | H02J 7/0047 307/130 |

OTHER PUBLICATIONS

Darin Lee Frink, et al., U.S. Appl. No. 15/810,582, filed Nov. 13, 2017, titled Calibrating Battery Fuel Gages.

* cited by examiner

*Primary Examiner* — John E Breene
*Assistant Examiner* — Jeffrey C Morgan
(74) *Attorney, Agent, or Firm* — Kilpatrick Townsend & Stockton LLP (57) ABSTRACT

Methods and systems for rerating a battery pack based on fuel gauge data are described, including capturing operational or fuel gauge data for a first battery pack that contains a plurality of battery cells, and determining, based on the fuel gauge data, a remaining capacity of the first battery pack. When the remaining capacity of the first battery pack falls below the minimum capacity; a new battery pack can be configured using some or all of the battery cells, and a second fuel gauge can be configured with new initial capacity and minimum capacity ratings.

21 Claims, 11 Drawing Sheets

MANAGEMENT OF USED BATTERY CELLS BASED ON FUEL GAUGE PARAMETERS

BACKGROUND

A datacenter typically contains a collection of computer servers and components for the management, operation, and connectivity of those servers, including short-term and long-term backup power solutions to prevent data loss during power loss events. In large datacenters, the cumulative backup power requirements can lead to the deployment of numerous high-capacity backup battery units (BBUs), which may see little use, or very significant use, depending on external factors affecting the datacenter. Such BBUs can also react to extremes of heat and/or cold. For these reasons, BBU service times can vary significantly, so that comparable BBUs in the same datacenter, or even in the same rack, might reach the ends of their service lives at different times. Due to the uncertainty in BBU usage, a variety of approaches have already been developed to monitor the health and projected capacity of BBU units based on usage patterns. For example, BBUs can be equipped with a fuel gauge that can estimate not only the current stored energy of a BBU, but can forecast the remaining capacity of a BBU as it ages based on such factors as time, charging parameters (e.g., impedance, voltage, current, and measured capacity) and environmental factors (e.g., temperature) so that BBUs can be removed from use only when they approach the end of their useful service life. However, additional methods of managing used battery cells are needed to further reduce waste.

BRIEF DESCRIPTION OF THE DRAWINGS

Various embodiments in accordance with the present disclosure will be described with reference to the drawings, in which.

DETAILED DESCRIPTION

In a modern datacenter, the continuity of power to servers and other electronic components can be maintained by employing redundant power supplies, including backup battery units (BBUs). Due to the high power demands of datacenter systems, and the unpredictable nature of line power outages, BBUs in a modern datacenter are typically well-distributed through the datacenter architecture and have large capacities. However, the precise lifespan of any given BBU is difficult to predict, because battery degradation is influenced to different degrees by many factors including frequency of use (charge and discharge), temperature at rest, rate of charge or discharge, initial capacity, and other factors. For these reasons, BBUs located at different parts of the same datacenter, or even in the same rack can be subject to different rates of degradation and thus have widely varying service life. As discussed above, using a BBU fuel gauge to forecast the remaining capacity of a BBU as it ages can reduce waste by predicting when a BBU will reach the end of its useful service life, at which time the materials within the battery packs of the BBU can be recycled. However, even when battery packs for a BBU have reached the end of their useful service life for a given application, significant charge capacity can still remain in the battery packs.

Embodiments described herein are directed to methods and systems of managing used BBUs and the battery packs therein to more efficiently handle battery packs at the end of their service life. In addition, embodiments are directed to methods of monitoring and re-rating BBUs or subsets of the battery packs contained in BBUs in order to repurpose the BBUs or battery packs, to reconfigure the battery packs for new uses, or to assemble new battery packs rated for alternative applications by taking advantage of the remaining capacity of depleted BBU battery packs.

In the description herein, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
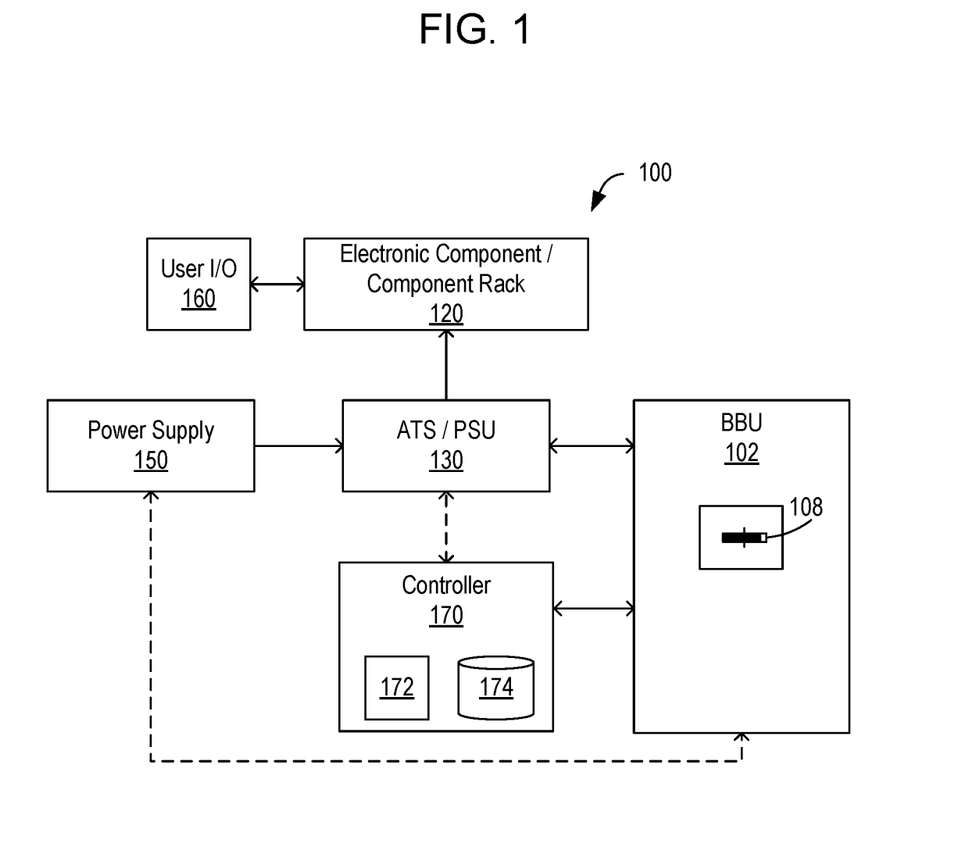
FIG. 1 is a high-level block diagram illustrating a system for powering electronic components including backup battery units (BBUs) with associated fuel gauges, in accordance with various embodiments.

Turning now to the figures, in which like numbers indicate like elements, FIG. 1 is a high-level block diagram illustrating a system 100 for powering electronic components 120 typical of a datacenter, including an automated transfer switching or power supply unit 130 that can provide power to the electronic components from either a power supply 150 or any suitable number of BBUs 102.

Each BBU 102 is associated with at least one fuel gauge 108, which monitors parameters of the BBU during use (e.g. events and rates during charge and discharge, impedance, actual capacity, voltage, current, temperature, etc.) in order to predict the change in BBU capacity over the service lifetime of the BBU, and to predict the end of that service life. Other use parameters that can be used by a fuel gauge for predicting BBU capacity over time include, but are not limited to: coulomb counting, compensated end of charge voltage, or other methods for monitoring current/energy charged to and discharge from battery cells. Further examples of parameters for calibrating BBU fuel gauges are described in, e.g., U.S. patent application Ser. No. 15/810, 582 entitled "Calibrating Battery Fuel Gages" and filed Nov. 13, 2017, which is hereby incorporated by reference. For example, for some BBUs, a total capacity of a new BBU may be on the order of about 500 Whr, and a rating requirement for use of the BBU may be about 250 Whr. Depending on the environmental and/or use factors to which the BBU is subjected, the BBU may degrade from its initial rated capacity of 500 Whr to its end-of-service capacity of 250 Whr over the course of about 300 cycles, under good conditions, or over the course of about 50 cycles under poor conditions. By monitoring BBU conditions, the fuel gauge can predict the timing of the end of this service life, with or without intermittent measurements being conducted to determine the BBU's actual capacity.

A BBU controller 170, which can include its own processing 172 and nonvolatile storage 174, can be used to monitor BBU performance by way of the fuel gauges 108; but it will be understood that in some embodiments, each BBU can include onboard processing and memory to perform the same tasks. The system 100 can also include one or more user I/O modules 160 to provide information to a user, respond to queries, or receive user instructions.

Figure 2:
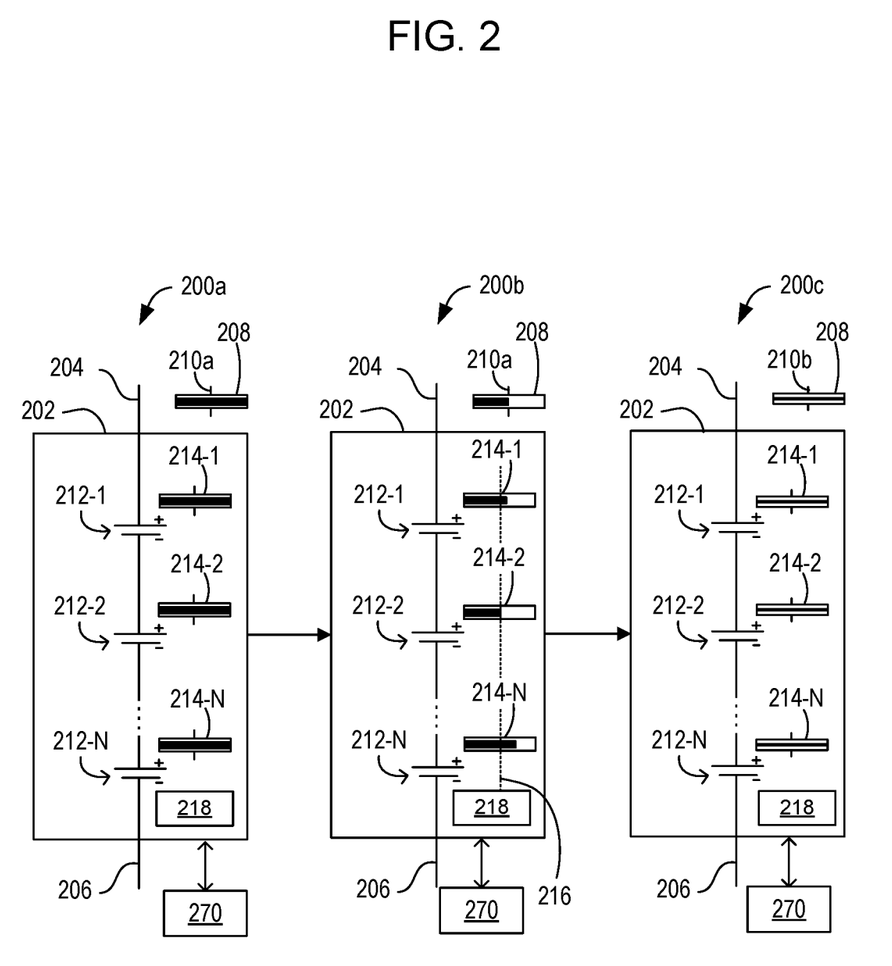
FIG. 2 is a block diagram illustrating an approach to managing a BBU based on fuel gauge data in accordance with the system of FIG. 1.

FIG. 2 is a block diagram illustrating an approach to managing a BBU based on fuel gauge data in accordance with the system of FIG. 1, in which a BBU or battery pack 202 that includes multiple battery cells 212-1, 212-2 . . . 212-N is intelligently rerated based on fuel gauge data. In an initial state 200a, the battery pack 202 is at an initially rated capacity, as indicated by a battery pack fuel gauge 208 measuring capacity of the battery pack as a whole, i.e. based on measuring capacity across the BBU terminals 204, 206. And end-of-life capacity 210a is determined based on the specific application for which the battery pack 202 is designed. For example, a BBU for datacenter service requires a high capacity to handle lengthy outages, therefore the end-of-life capacity of a BBU battery pack may be fairly high, e.g. half of the initial capacity or more. Battery packs for emergency applications may have stricter requirements, and thus a higher end-of-life capacity. For less critical applications, e.g. in recreational or consumer goods, the tolerated end-of-life capacity may be lower. Individual battery cells 212 can be monitored by way of individual fuel gauge data 214 as well.

In operation, the battery pack 202 will gradual degrade until the capacity of the battery pack reaches the end-of-life capacity 210a, as predicted or measured at the battery pack fuel gauge 208 and as shown in second condition 200b. When this occurs, the end of the service life can be reported by an onboard controller 218 and/or by an external controller 270 monitoring the fuel gauge 208. In some embodiments, the determination that the battery pack has reached the end of its service life can be made based on the individual battery cell capacities 214 by comparing the individual capacities to a minimum capacity 216. For example, as shown, battery cell 214-2 has degraded to the minimum capacity 216, resulting in the battery pack 202 failing to pass.

When the battery pack 202 has failed to pass, the fuel gauge data associated with the battery cells 214 can be analyzed to determine if the battery pack, or if any individual cells, have encountered unusual failure (i.e., if any battery packs have defects reflected in different performance characteristics, or if any battery packs have suffered total failure, or other failure modes). It is expected that individual battery cells 214 may degrade at different rates, therefore, in some embodiments the capacity losses of each individual battery cell may be compared with an expected capacity loss, and excluded if that capacity loss varies from the expected capacity loss beyond a threshold. If the battery cells 214 pass one or more of such criteria, the battery cells may be repurposed for a new battery pack or a new application. In one example, as shown in final condition 200c, the battery pack 202 has been repurposed by rerating each battery cell 212 to a new initial capacity based on the lowest remaining capacity among the individual battery cells at the second condition 200b. Further, fuel gauge 208 has been reset based on the new initial capacity of the battery pack 202 as a whole, and individual fuel gauges 214 can be similarly reset, with a new minimum capacity 210b corresponding to the requirements of a new, lower-capacity application to which the battery pack can be assigned.

Figure 3:
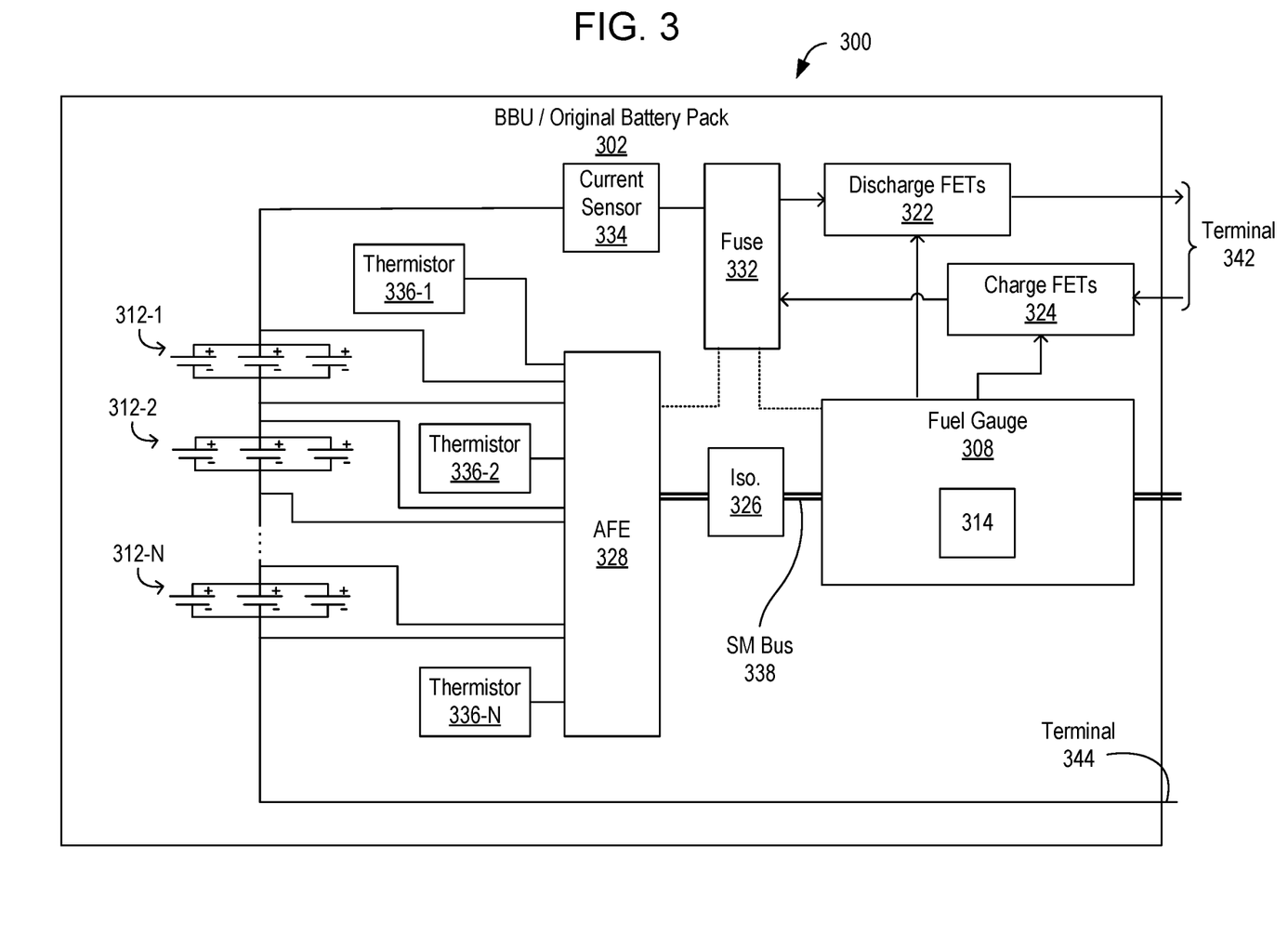
FIG. 3 is a block diagram illustrating the architecture of an example of a BBU in accordance with the system of FIG. 1.

FIG. 3 is a block diagram 300 illustrating the architecture of an example of a BBU 302 or battery pack in accordance with the system of FIG. 1, and to which techniques described with reference to FIG. 2 or the following figures can be applied. It should be understood that the block diagram 300 illustrates one implementation of a BBU, but that the principles described in this disclosure can be applied to a variety of similar systems. The BBU 302 includes a plurality of battery cells or groups of battery cells 312-1, 312-2, 312-N, each of which has an individual power storage capacity, typically on the order of about 1-2 Ahr. Individual battery cells 312 can be used in combination as shown to provide much larger power storage capacities for the BBU or battery pack 302 as a whole, on the order of 250-500 Whr, or over 1000 Whr, or over 10,000 Whr, depending on the power storage capacities of the individual battery cells 312 and the number of individual battery cells deployed. In some specific embodiments, individual battery cells 312 are organized into multiple sets of series and parallel battery cells, e.g. 6 parallel sets of 14 series battery cells, or other comparable arrangements. According to some embodiments, as shown in FIG. 3, battery cells 312 can be arranged in mixed parallel/series arrangements, e.g. in groups having 3 or more parallel battery cells (e.g., groups of 3, 6, 8, or 10 cells, or in some cases up to about 20 cells in parallel) that are then placed in series or strings of 10 or more, or 14 or more, layers of battery cell groups. Grouping battery cells in such a manner can help to maintain power balance among the cells while providing a specified voltage, current capacity, or power storage capacity. Battery cells 312 can also be arranged in series in a singular manner without being first arranged in parallel groups.

The BBU 302 is rechargeable. When in use, the BBU can be placed into a discharge or charging mode by way of a switch or transistor assembly, e.g., a discharge field effect transistor (FET) module 322, or a charging FET module 324. Charging and discharging can be controlled by way of a fuse 332 and a current sensor 334 that can be used to monitor and limit charging or discharging rates, respectively. Control over current between the battery cells 312 can be implemented by connecting the battery cells to an analog front-end (AFE) or similar controller, which can further include a series of thermistors 336-1, 336-2, 336-N for modulating and measuring current.

Fuel gauge 308 is configured to monitor battery performance parameters of the BBU 302 as a whole as well as battery performance parameters of the individual battery cells 312, e.g. by way of subunits 314 corresponding to the battery cells. The fuel gauge 308 can be connected directly with elements of the BBU 302, or can be connected by way of a system management bus (SMBus) 338 with or without an isolation module 326. The SMBus 336 can also be used to communicate fuel gauge data outside the BBU. The fuel gauge 308 can track the immediate power supply based on a variety of factors, such as voltage, current, impedance, or other measured factors. Over time, conventional battery fuel gauges can become inaccurate as the battery cell power storage capacities degrade. The fuel gauge 308 can be recalibrated over time by employing a charge/discharge cycle to assess total power storage capacity. Further, the fuel gauge 308 can predict changes in the power storage capacity of the BBU 302 or of the individual battery cells 312 based on performance characteristics of the battery cells (e.g., current and impedance) and/or external factors like storage time, storage temperature, a number of charge/discharge cycles to which the battery cells in the BBU have been subjected, or other suitable parameters and characteristics.

Figure 4:
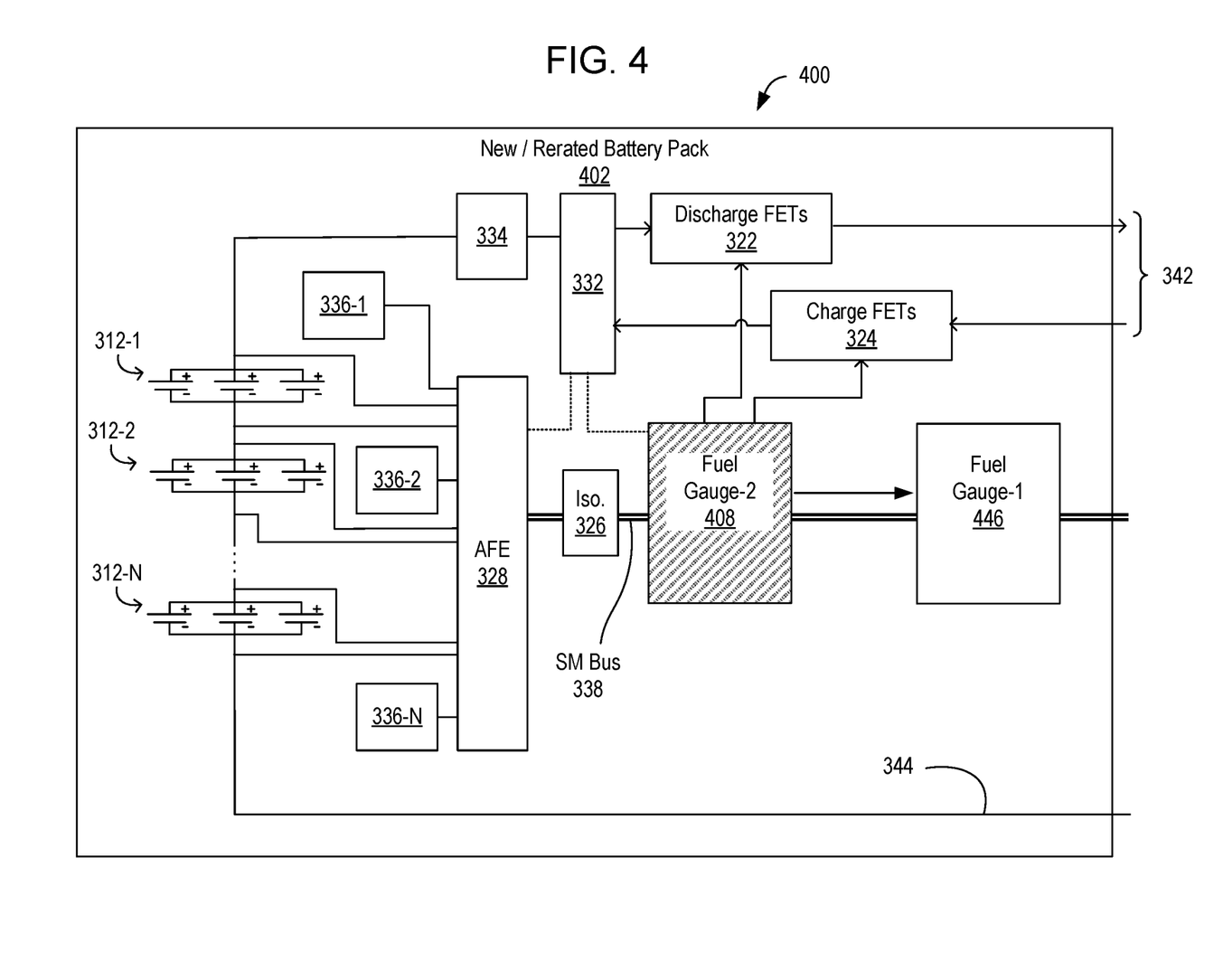
FIG. 4 is a block diagram illustrating a first approach for reconfiguring a battery pack based on fuel gauge data and transferring fuel gauge data to a new battery back.

Various approaches to rerating and repurposing the battery pack 302 and/or battery cells 312 are described below with reference to FIGS. 4-11, in response to the detection that a power storage capacity of the battery cells has degraded to a reduced power storage capacity at the fuel gauge 308. For example, FIG. 4 is a block diagram 400 illustrating a first approach for reconfiguring a battery pack based on fuel gauge data by transferring fuel gauge data to repurpose battery pack 302 into a new battery pack 402 having a reduced power storage capacity, in accordance with various embodiments. Fuel gauge 308 can be reassigned as a secondary fuel gauge 408, which can transfer fuel gauge data to a new primary fuel gauge 446. Parameters of the new primary fuel gauge can be set based on the reduced power storage capacity, e.g. setting a new maximum power storage capacity for the new battery pack 402 based on the cumulative power storage capacities of the used battery cells 312. In addition, the fuel gauge data transferred from the secondary fuel gauge 408 can be employed by the primary fuel gauge 446 to predict the power storage capacity of the new battery pack 402 over time.

Figure 5:
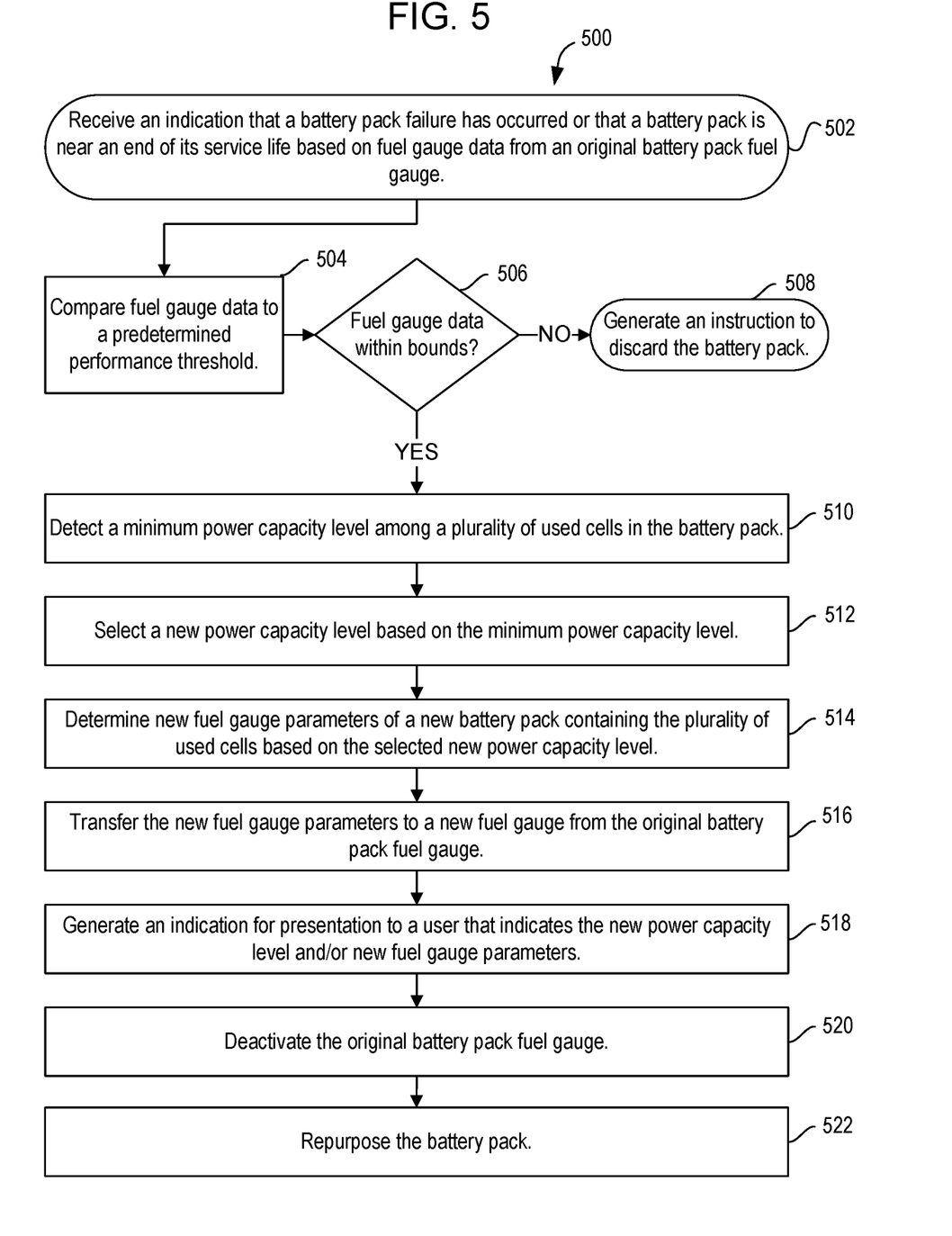
FIG. 5 illustrates a first process for managing the transfer of fuel gauge data in accordance with the approach of FIG. 4.

FIG. 5 illustrates a first process 500 for managing the transfer of fuel gauge data in accordance with the approach of FIG. 4, in conjunction with any of the systems or devices shown in FIGS. 1-3. Some or all of process 500, as well as processes 700, 900, and 1100 described below (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. In various embodiments, the processes 700, 900, or 1100 may be carried out by, e.g., a centralized controller such as BBU controller 170 (FIG. 1), by distributed control by onboard processing at one or more BBU's 102, or by distributed control by one or more power supply controllers associated with the switching systems or power supply units 130.

In the process 500, the system can receive an indication that a battery pack failure has occurred or that a battery pack is near an end of its service life based on fuel gauge data from an original battery pack fuel gauge (act 502). As a preliminary step, the system can determine whether to indicate the battery pack for rerating based on the performance of the component battery cells. In one embodiment, the system can compare fuel gauge data to a predetermined performance threshold to assess whether the battery cells are appropriate for rerating (act 504). A non-exhaustive list of factors that may disqualify a battery pack for rerating includes, e.g., whether battery cells have been exposed to extremes of temperature or load, whether battery cells have been overcharged or discharged beyond a design window, whether battery cells exhibit current, voltage, or impedance values outside a design window, whether battery cells have decreased in capacity at a rate that differs from that of comparable battery cells beyond a predefined margin, whether battery cells in series are unbalanced outside a design range, or other factors. If the fuel gauge data is determined to be within bounds (act 506), the system can proceed to rerate the battery pack or cells in the battery pack. Otherwise, the system can generate an instruction, i.e. for a user, to discard the battery pack or some cells within the battery pack (act 508).

If the system determines that the battery pack can be rerated, the system can then determine a minimum power capacity level among a plurality of used cells in the battery pack (act 510). Next, the system selects a new power capacity level for the new battery pack based on the minimum power capacity level (act 512). The system can then determine new fuel gauge parameters for the new battery pack containing that contains the used battery cells based on the selected new power capacity level (act 514), and transfer the new fuel gauge parameters to the new fuel gauge (act 516). In some embodiments, the system can generate an indication for presentation to a user that indicates the new power capacity level and/or new fuel gauge parameters (act 518), and may also deactivate the original battery pack fuel gauge once the new fuel gauge is active and calibrated (act 520). Once rerated, the battery pack can be repurposed and installed to power a new application or device (act 522).

Figure 6:
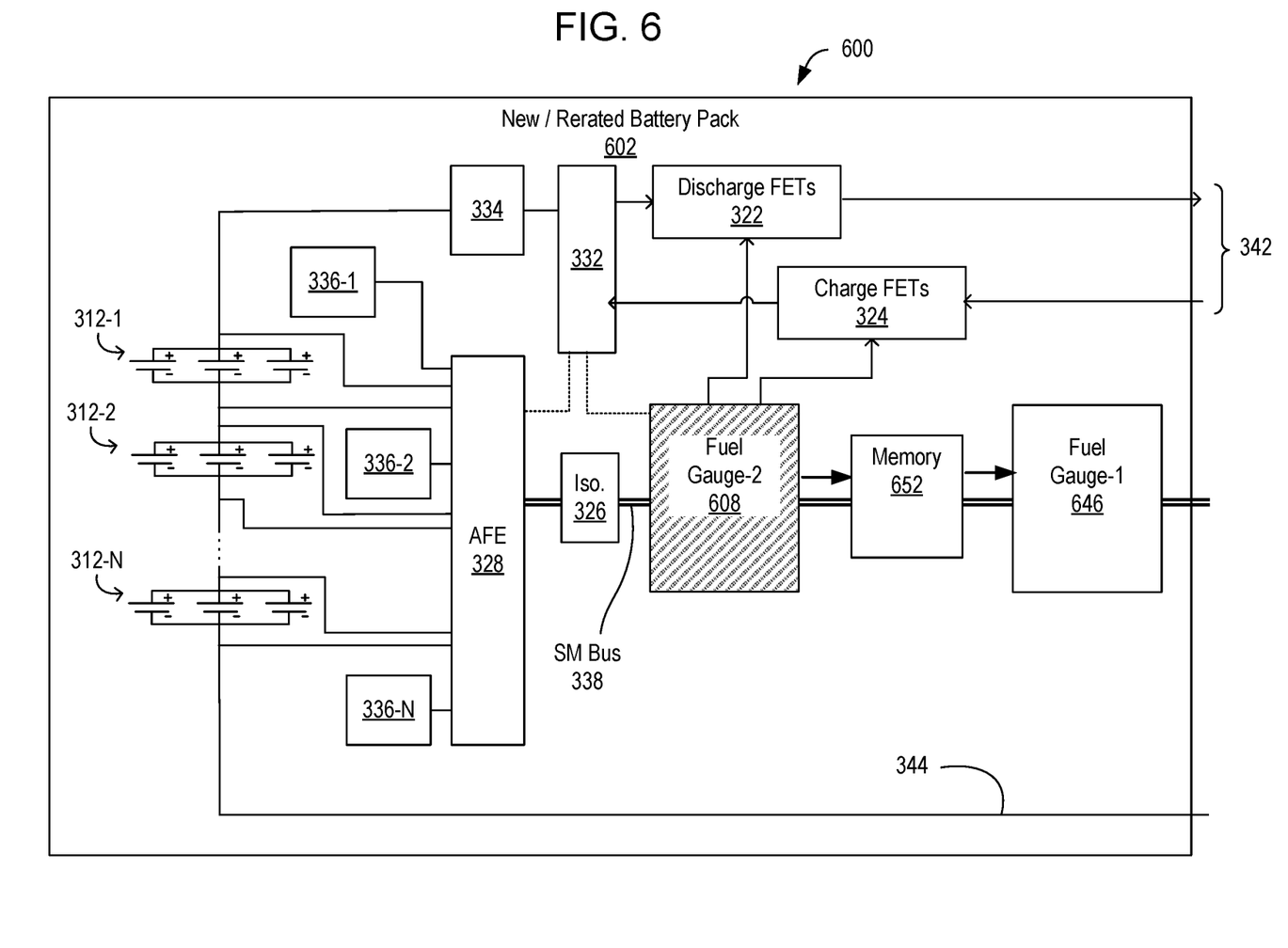
FIG. 6 is a block diagram illustrating a second approach for reconfiguring a battery pack based on fuel gauge data.

FIG. 6 is a block diagram 600 illustrating a second approach for reconfiguring a battery pack based on fuel gauge data by transferring fuel gauge data to a new battery back 602 having a reduced power storage capacity, in accordance with various embodiments of the present disclosure. Fuel gauge 308 can be reassigned as a secondary fuel gauge 608, which can transfer fuel gauge data to a non-volatile memory module 652. Fuel gauge data stored in the memory module 652 can be transferred to calibrate a new primary fuel gauge 646 associated with the new battery pack 602 and rated based on the partially degraded battery cells 312.

Figure 7:
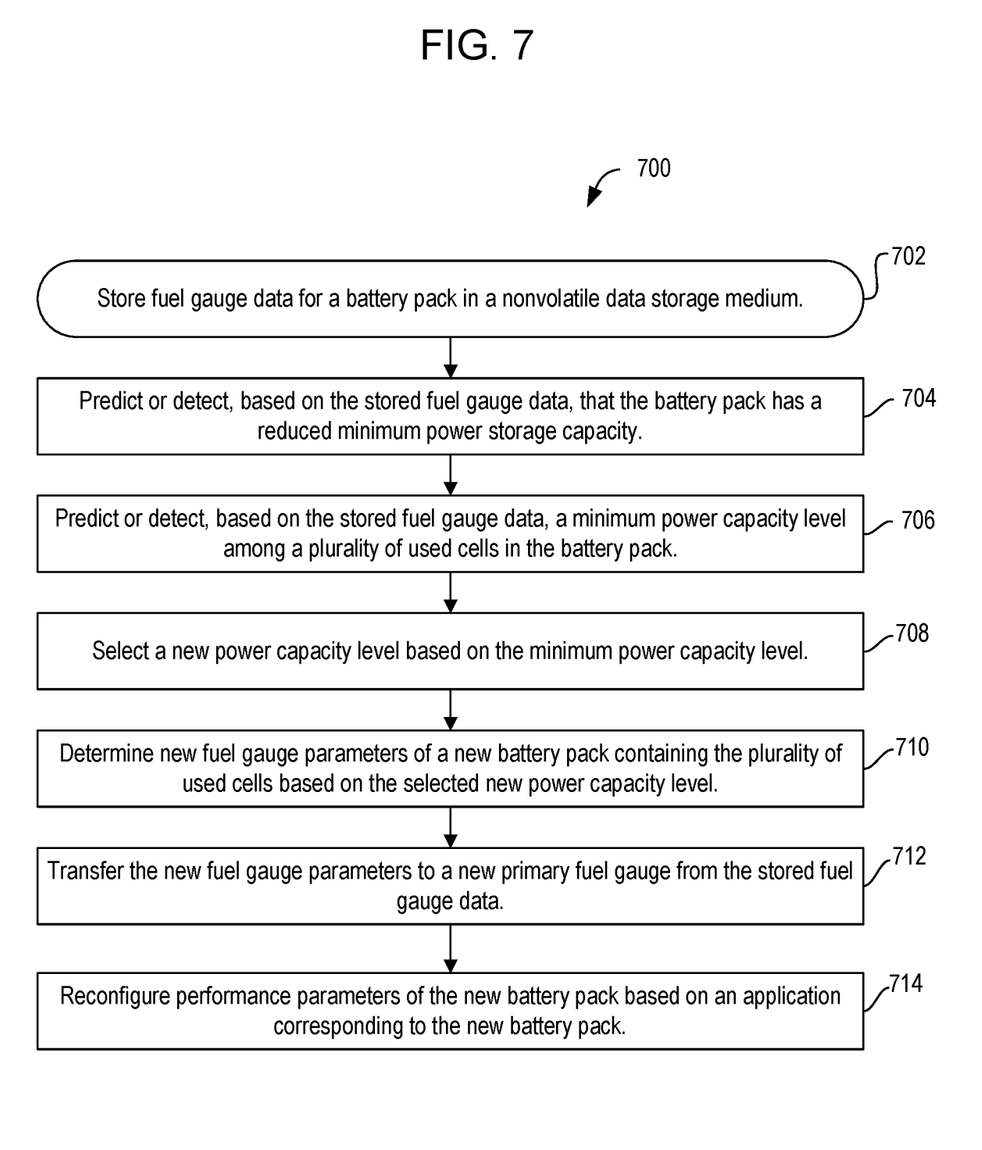
FIG. 7 illustrates a second process for managing the transfer of fuel gauge data in accordance with the approach of FIG. 6.

FIG. 7 illustrates a second process 700 for managing the transfer of fuel gauge data in accordance with the approach of FIG. 6, in conjunction with any of the systems or devices shown in FIGS. 1-3. In accordance with various embodiments of process 700, the system can store fuel gauge data for a battery pack in a nonvolatile data storage medium (act 702). The system can then predict or detect, based on the stored fuel gauge data, that the battery pack is approaching a reduced service capacity (act 704).

When the battery back has reached a reduced service capacity, the system can determine a minimum power capacity level among a plurality of used cells in the battery pack (act 706). The system can then select a new power capacity level based on the minimum power capacity level (act 708), and determine new fuel gauge parameters for a new battery pack containing the used cells based on the selected new power capacity level (act 710). After reassigning the used cells to the new battery pack, the system can transfer the new fuel gauge parameters to a new primary fuel gauge from the stored fuel gauge data (act 712). In some embodiments, the system can configure performance parameters of the new battery pack based in part on an application to which the new battery pack is assigned (act 714), including but not limited to reconfiguring the arrangement of battery cells to adjust the power capacity, voltage, current, or other performance parameters.

Figure 8:
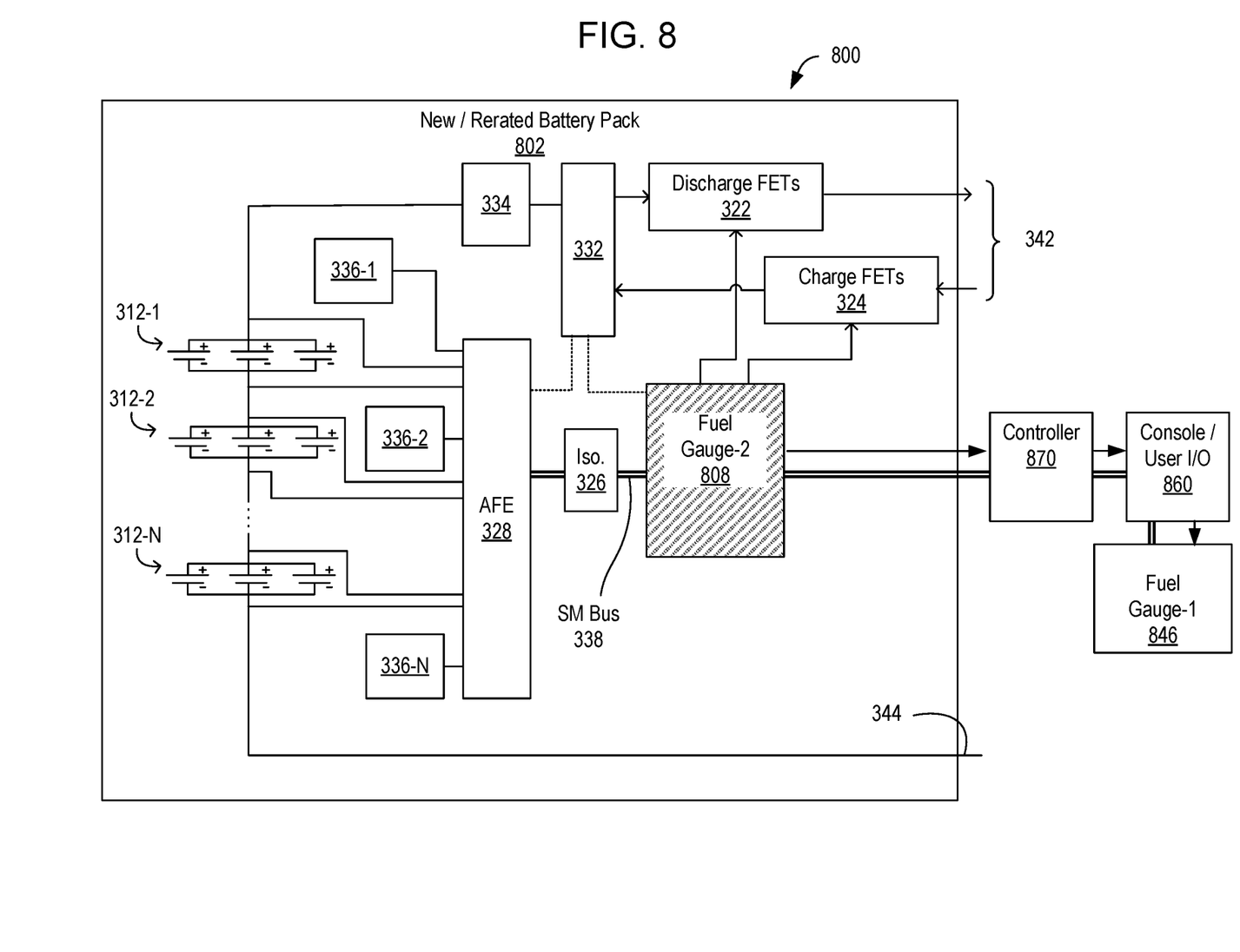
FIG. 8 is a block diagram illustrating a third approach for reconfiguring a battery pack based on fuel gauge data.

FIG. 8 is a block diagram 800 illustrating a third approach for reconfiguring a battery pack based 802 on fuel gauge data, in accordance with various embodiments of the present disclosure. Fuel gauge 308 can be reassigned as a secondary fuel gauge 808, which can transfer fuel gauge data outside the battery pack 802 to a new primary fuel gauge 846, e.g. by the SM Bus 338. In some embodiments, fuel gauge data can be transferred by way of a centralized controller 870, optionally under the control of a computer system or user control module 860.

Figure 9:
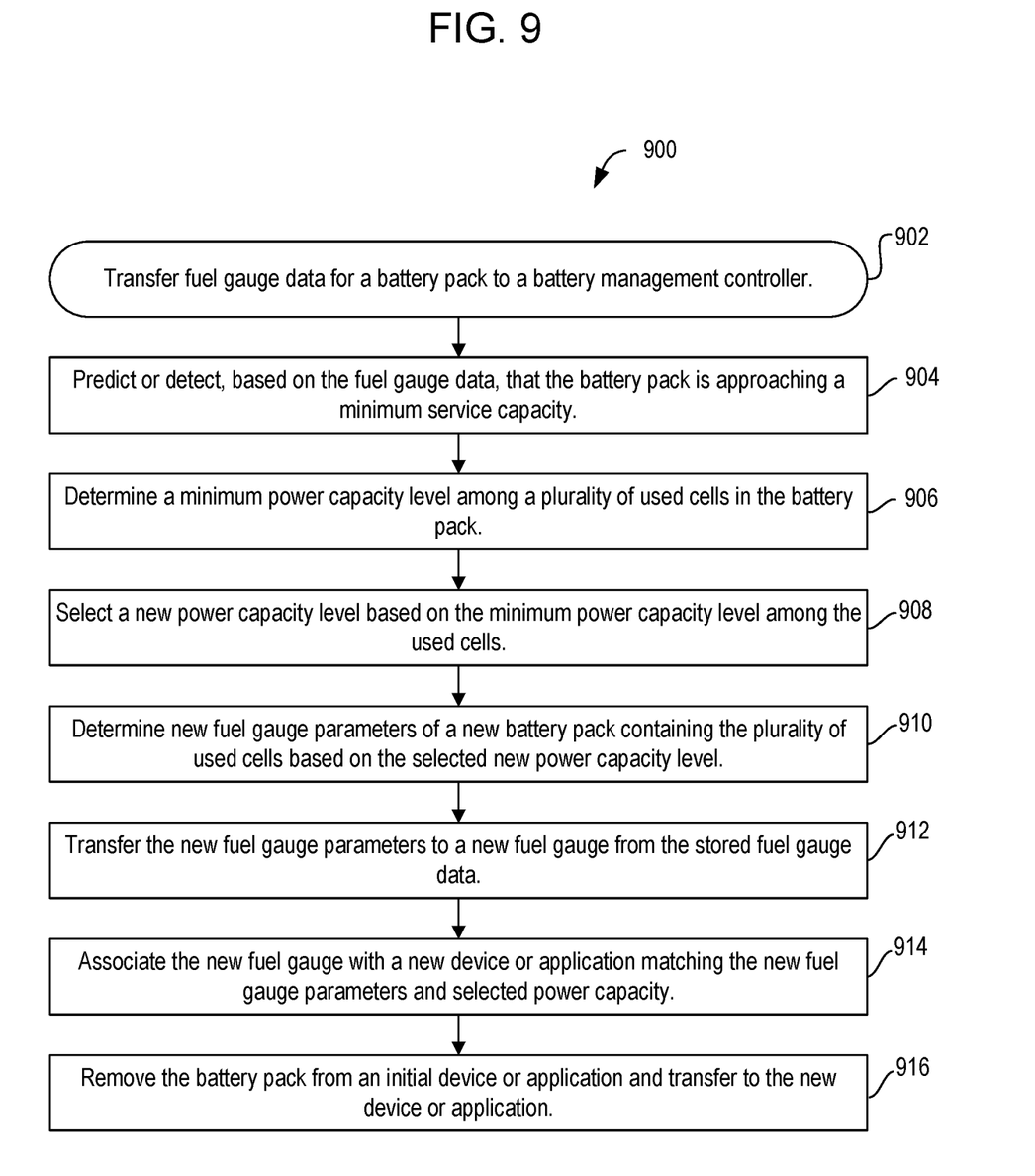
FIG. 9 illustrates a third process for managing the transfer of fuel gauge data in accordance with the approach of FIG. 8.

FIG. 9 illustrates a third process 900 for managing the transfer of fuel gauge data in accordance with the approach of FIG. 8, in conjunction with any of the systems or devices shown in FIGS. 1-3. In accordance with various embodiments, the system can transfer fuel gauge data for a battery pack to a battery management controller (act 902). The system can then predict or detect, based on the fuel gauge data, that the battery pack is approaching a minimum service capacity (act 904), and determine a minimum power capacity level among the used cells in the battery pack (act 906). A new power capacity level for a new or rerated battery pack can be determined based on the minimum power capacity level among the used battery cells (act 908), in conjunction with a selected architecture for assembling the used battery cells.

The system can then determine new fuel gauge parameters of a new battery pack containing the plurality of used cells based on the selected new power capacity level (act 910), and transfer the new fuel gauge parameters to a new fuel gauge from the stored fuel gauge data (act 912). Once the new fuel gauge is configured, the system can associated the new fuel gauge with a new device or application matching the new fuel gauge parameters and selected power capacity (act 914). In some embodiments, the new or rerated battery pack can include more or fewer individual battery cells than the original battery pack by rearranging the battery cells to a new configuration, or by removing select battery cells from an initial device or application and transferring the battery cells to the new device or application (act 916). In some cases, repurposing individual battery cells in this manner can include assembling battery packs that are small relative to the original battery pack, e.g., for use in consumer devices. In some specific embodiments, repurposed individual battery cells can be placed in single-cell battery packs that are rated according to the measured or predicted power capacity of the individual battery cell at the end-of-life of the original battery pack from which the battery cell is extracted. In such cases, the individual battery cell can have a corresponding fuel gauge that reflects this end-of-life capacity. According to some other embodiments, repurposed individual battery cells can be assembled together in large battery packs. Although individual battery cells of the new, rerated battery pack will have lower energy density than new battery cells, a variety of high-capacity battery packs can be assembled by adding battery cells and arranging the battery cells in large groups in series.

Figure 10:
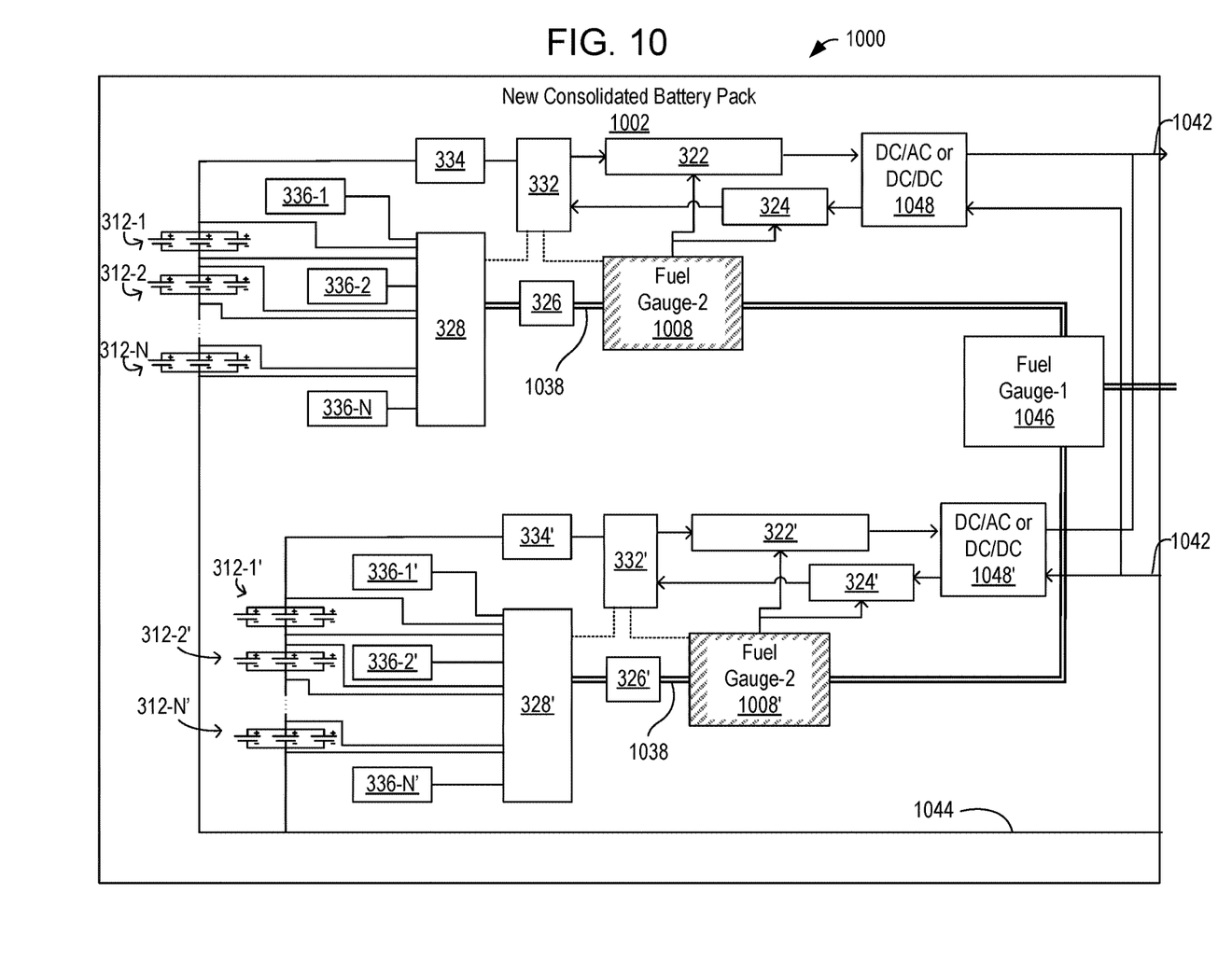
FIG. 10 is a block diagram illustrating a fourth approach to configuring a consolidated battery pack by transferring fuel gauge data from component fuel gauges to the consolidated battery back.

FIG. 10 is a block diagram 1000 illustrating a fourth approach for reconfiguring two or more battery packs based on fuel gauge data to a consolidated battery back 1002, in accordance with various embodiments. In the consolidated battery pack 1002, components from two distinct battery packs as described according to FIG. 3 (e.g. battery pack 302) are show combined, with components from an original battery pack retaining the same numbering and components from an added battery pack denoted as N'. According to this approach, the original fuel gauges 308 can be reassigned as new secondary fuel gauges 1008 and 1008', and connected to a new primary fuel gauge 1046 by way of the serial bus 1038. Battery cells 312-1, 312-2, 312-N can be placed in parallel or in series with battery cells 312-1', 312-2', 312-N', as desired depending on the performance characteristics required of the consolidated battery pack. Converters 1048, 1048' can be used to condition power output from or charging current input to the terminals 1042 of the consolidated battery pack 1002.

Figure 11:
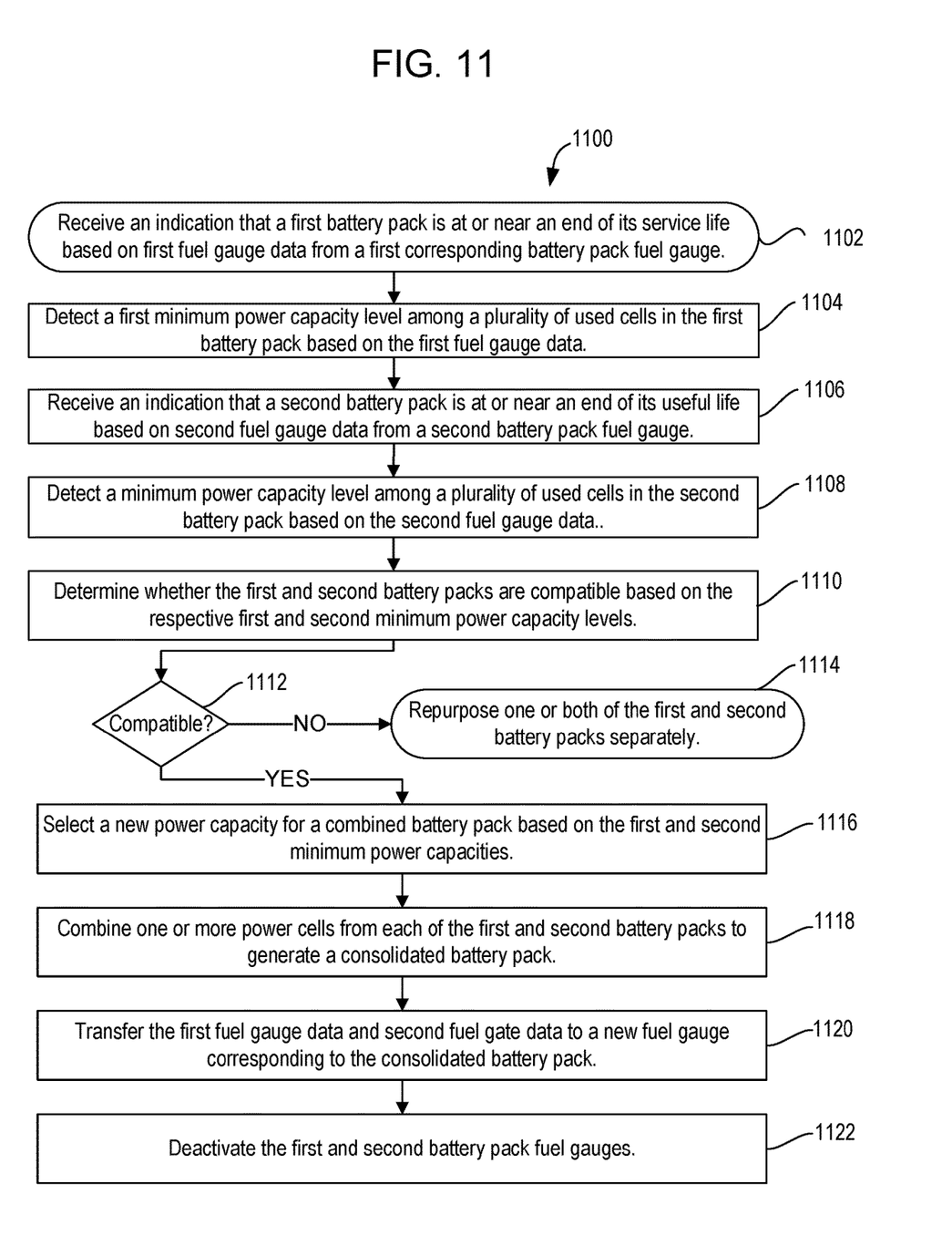
FIG. 11 illustrates a fourth process for managing the transfer of fuel gauge data in accordance with the approach of FIG. 10.

FIG. 11 illustrates a fourth process 1100 for managing the transfer of fuel gauge data in accordance with the approach of FIG. 10, in conjunction with any of the systems or devices shown in FIGS. 1-3. In accordance with various embodiments of process 1100, the system can receive an indication that a first battery pack is at or near an end of its service life based on first fuel gauge data from a first corresponding battery pack fuel gauge (act 1102), and can detect a first minimum power capacity level among a plurality of used cells in the first battery pack based on the first fuel gauge data (act 1104), similar to methods described above with respect to FIGS. 4-9. The system can also receive an indication that a second battery pack is at or near an end of its useful life based on second fuel gauge data from a second battery pack fuel gauge (act 1106), and similarly, detect a minimum power capacity level among a plurality of used cells in the second battery pack based on the second fuel gauge data (act 1108). The system can determine whether the first and second battery packs are compatible based on the respective first and second minimum power capacity levels (act 1110), and if compatible (act 1112), the battery packs can be reconfigured to form a combined battery pack. Otherwise, one or both of the battery packs can be repurposed separately from the other, retained for a future match, or discarded (act 1114).

The system can select a new power capacity for a combined battery pack based on the first and second minimum power capacities (act 1116). The power cells from each of the first and second battery packs to generate the consolidated battery pack (act 1118), at which time the system can transfer the first fuel gauge data and second fuel gate data to a new fuel gauge corresponding to the consolidated battery pack (act 1120), which can then use the fuel gauge data to improve monitoring of battery pack capacity and to predict stored power levels in the consolidated battery pack. In some embodiments, the first and second battery pack fuel gauges can be deactivated after the data transfer (act 1122). Such techniques as described with reference to FIGS. 10-11 can be used to produce a variety of high-capacity battery packs, such as battery packs for long-term energy storage, automotive or consumer applications, or even datacenter power backup, depending on the remaining storage capacity of the first and second battery packs.

Various computing environments may be used, as appropriate, to implement various embodiments as described herein including web- or cloud-based computing environments, computing environments based on local controllers, or combinations of the above. User or client devices can include any of a number of general purpose personal computers, such as desktop or laptop computers running a standard operating system, as well as cellular, wireless and handheld devices running mobile software and capable of supporting a number of networking and messaging protocols. Such an environment also can include a number of workstations running any of a variety of commercially-available operating systems and other known applications for purposes such as development and database management. These workstations also can include other electronic devices, such as dummy terminals, thin-clients, gaming systems and other devices capable of communicating via a network and used for communicating with sensors, displays, actuators, and user interfaces, among other devices.

For example, user interfaces (such as user I/O module 108, FIG. 1) can include any appropriate device operable to send and receive requests, messages, or information over an appropriate network and convey information back to a user of the device. Examples of such devices include portable displays, personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used in conjunction with such a network can depend at least in part upon the type of network and/or environment selected. Protocols and components for communicating via such a network are well known and will not be discussed herein in detail. Communication over the network can be enabled by wired or wireless connections and combinations thereof.

Suitable computing environments can include, in various embodiments, a server and data store. It should be understood that there can be several servers, layers, or other elements, processes, or components, which may be chained or otherwise configured, which can interact to perform tasks such as obtaining data, processing said data, and communicating data or with users. For example, according to various embodiments, a controller such as controller 102 (FIG. 1) can include a server and/or a virtual machine emulated by a server. As used herein the term "data store" refers to any device or combination of devices capable of storing, accessing, and retrieving data, which may include any combination and number of data servers, databases, data storage devices, and data storage media, in any standard, distributed, or clustered environment. The server can include any appropriate hardware and software for integrating with the data store as needed to execute aspects of one or more applications for the client device, handling a majority of the data access and logic for an application. It should be understood that servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store can include a mechanism for storing data for reporting, analysis, or other such purposes. The data store is operable, through logic associated therewith, to receive instructions and obtain, update or otherwise process data in response thereto.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

A computing environment according to various embodiments can be a distributed computing environment utilizing several computer systems and components that are interconnected via communication links, using one or more computer networks or direct connections. However, it will be appreciated by those of ordinary skill in the art that the embodiments discussed above could operate equally well in a computing environment having fewer or a greater number of components, including systems operated under the control of a single computing device in communication with any suitable combination of the various sensors, input/output devices and/or actuators discussed herein.

Some embodiments may utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infra-red network, a wireless network, and any combination thereof.

Computing environments as discussed herein can include a variety of data stores and other memory and storage media as discussed above. These media can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Suitable media can also include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of repurposing a battery pack used to provide backup power in a datacenter, the method comprising:
    using a battery pack in a datacenter to provide backup power to a plurality of electronic components, the battery pack comprising battery cells and a fuel gauge that tracks an amount of power stored in the battery cells, the battery pack having an initial power storage capacity;
    detecting that a power storage capacity of the battery cells has degraded to a reduced power storage capacity;
    incorporating the battery cells into a second battery pack that includes a second fuel gauge that tracks an amount of power stored in the second battery pack; and
    configuring the second fuel gauge such that a fully charged state of the second fuel gauge reflects the reduced power storage capacity of the battery cells.

2. The method of claim 1, wherein detecting that the power storage capacity of the battery cells has degraded to the reduced power storage capacity comprises detecting that at least one of the battery cells has degraded to have an individual reduced power storage capacity below a predetermined threshold power storage capacity.

3. The method of claim 1, further comprising:
    collecting operational data corresponding to fuel gauge readings during use of the battery pack; and
    predicting that the power storage capacity of the battery cells has degraded to the reduced power storage capacity based on the operational data.

4. The method of claim 3, wherein configuring the second fuel gauge comprises:
    defining a second initial power storage capacity based on the reduced power storage capacity; and
    assigning the second initial power storage capacity to the second fuel gauge.

5. The method of claim 3, further comprising:
    collecting operational data corresponding to fuel gauge readings during use of the battery pack;
    storing the operational data in nonvolatile memory;
    predicting that the power storage capacity of the battery cells has degraded to the reduced power storage capacity based on the operational data; and configuring the second fuel gauge based on the operational data by accessing the nonvolatile memory.

6. The method of claim 3, wherein the second fuel gauge is separated from the battery pack, the method further comprising:
selecting a new application that corresponds with the reduced power storage capacity of the battery cells;
configuring the second fuel gauge based on power demands corresponding to the new application;
removing the battery cells from an initial application; and
operably connecting the second battery pack with the new application.

7. The method of claim 3, further comprising:
using a third battery pack in the datacenter, the third battery pack comprising a third set of battery cells and a third fuel gauge that tracks an amount of power stored in the third set of battery cells;
detecting that a power storage capacity of the third set of battery cells has degraded;
incorporating the third set of battery cells into the second battery pack; and
configuring the second fuel gauge to reflect a combined power storage capacity of the battery cells and third set of battery cells in the second battery pack.

8. A method, comprising:
capturing fuel gauge data of a first battery pack comprising battery cells and a fuel gauge that tracks an amount of power stored in the battery cells, the first battery pack having a first initial capacity;
determining, based on the fuel gauge data, that a power storage capacity of the battery cells has degraded to a reduced power storage capacity; and
configuring a second fuel gauge to reflect the reduced power storage capacity of the battery cells, the second fuel gauge corresponding to a second battery pack comprising one or more of the battery cells.

9. The method of claim 8, wherein configuring the second fuel gauge comprises setting a different discharge current or/and discharge voltage for the second battery pack with respect to an initial discharge current or discharge voltage associated with the first battery pack.

10. The method of claim 8, wherein determining that the power storage capacity of the battery cells has degraded comprises determining that one or more of the battery cells has fallen below an individual minimum capacity.

11. The method of claim 8, wherein configuring the second fuel gauge comprises setting a second initial capacity for each battery cell of the second battery pack based on the reduced power storage capacity associated with the battery cells of the first battery pack.

12. The method of claim 8, wherein the fuel gauge data comprises at least one of temperature data, current data, voltage data, capacity data or impedance data.

13. The method of claim 8, further comprising:
comparing the fuel gauge data to a predetermined performance threshold indicative of damage to one or more of the battery cells; and
in response to detecting that the fuel gauge data exceeds the predetermined performance threshold, generating an instruction to discard the one or more of the battery cells.

14. The method of claim 8, further comprising;
storing the fuel gauge data in a nonvolatile storage medium;
determining, based on the fuel gauge data, a minimum power capacity level among the battery cells in the first battery pack;

determining that the power storage capacity of the first battery pack has degraded based on the minimum power capacity level among the battery cells; and
configuring the second fuel gauge based on the minimum power capacity level.

15. The method of claim 8, further comprising;
storing the fuel gauge data at a power management controller separate from the first battery pack;
selecting a new application or device having a power capacity requirement based on the reduced power storage capacity of the battery cells;
configuring the second fuel gauge based in part on the power capacity requirement of the new application; and
applying the second battery pack to the new application.

16. The method of claim 15, further comprising:
selecting a subset of the battery cells based on the power capacity requirement; and
assembling the second battery pack comprising the subset of the battery cells.

17. The method of claim 8, wherein the battery cells are a first plurality of battery cells, and further comprising:
capturing fuel gauge data of a third battery pack comprising a second plurality of battery cells and a third fuel gauge that tracks an amount of power stored in the second plurality of battery cells;
determining, based on the fuel gauge data, that a power storage capacity of the second plurality of battery cells has degraded; and
configuring the second fuel gauge to reflect a combined power storage capacity of the first plurality of battery cells and the second plurality of battery cells corresponding to the first and third battery packs, respectively.

18. A battery pack, comprising:
a plurality of battery cells; and
a fuel gauge connected with the battery cells and configured to store operational data and track an amount of power stored in the battery cells, wherein:
at least a portion of the operational data comprises prior operational data for an original battery pack;
at least some of the plurality of battery cells were used in the original battery pack; and
a power storage capacity of the battery pack is less than a power storage capacity associated with the original battery pack.

19. The battery pack of claim 18, wherein the plurality of battery cells were used in the original battery pack, and wherein a power storage capacity of each battery cell corresponds to a prior minimum battery cell capacity from among the plurality of battery cells when assembled as the original battery pack.

20. The battery pack of claim 18, wherein:
the original battery pack is a first original battery pack;
at least some of the plurality of battery cells originated from a second original battery pack different than the first original battery pack; and
a power storage capacity of the plurality of battery cells corresponds to a minimum power storage capacity associated with the first and second original battery packs.

21. A battery, comprising:
a battery cell that was previously used in an original battery pack having a plurality of battery cells; and
a fuel gauge connected with the battery cell and configured to track an amount of power stored in the battery cell, wherein the fuel gauge is calibrated based on a storage capacity of the battery cell that was previously exhibited when the battery cell was used in the original battery pack.

\* \* \* \* \*